US011587764B2

(12) United States Patent
Gandikota et al.

(10) Patent No.: US 11,587,764 B2
(45) Date of Patent: *Feb. 21, 2023

(54) MAGNETIC HOUSING SYSTEMS

(71) Applicant: Applied Materials, Inc., Santa Clara, CA (US)

(72) Inventors: Srinivas Gandikota, Santa Clara, CA (US); Tza-Jing Gung, San Jose, CA (US); Samuel E. Gottheim, Santa Clara, CA (US); Timothy Joseph Franklin, Campbell, CA (US); Pramit Manna, Santa Clara, CA (US); Eswaranand Venkatasubramanian, Santa Clara, CA (US); Edward Haywood, Santa Clara, CA (US); Stephen C. Garner, Newark, CA (US); Adam Fischbach, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 223 days.

This patent is subject to a terminal disclaimer.

(21) Appl. No.: 16/671,330

(22) Filed: Nov. 1, 2019

(65) Prior Publication Data

US 2020/0144029 A1 May 7, 2020

Related U.S. Application Data

(60) Provisional application No. 62/888,332, filed on Aug. 16, 2019, provisional application No. 62/755,847, filed on Nov. 5, 2018.

(51) Int. Cl.
*H01L 21/00* (2006.01)
*H01J 37/32* (2006.01)
(Continued)

(52) U.S. Cl.
CPC ...... *H01J 37/32082* (2013.01); *C23C 16/455* (2013.01); *C23C 16/505* (2013.01);
(Continued)

(58) Field of Classification Search
None
See application file for complete search history.

(56) References Cited

U.S. PATENT DOCUMENTS 5,660,744 A * 8/1997 Sekine ............... H01J 37/3266
204/298.37
5,717,294 A * 2/1998 Sakai ............... H01J 37/32623
156/345.46

(Continued)

FOREIGN PATENT DOCUMENTS

JP   2000268995 A * 9/2000
WO  2016018505 A1   2/2016

OTHER PUBLICATIONS

International Search Report/Written Opinion issued to PCT/US2020/046470 dated Nov. 23, 2020.

(Continued)

*Primary Examiner* — Sylvia MacArthur
*Assistant Examiner* — Michelle Crowell
(74) *Attorney, Agent, or Firm* — Patterson + Sheridan, LLP

(57) ABSTRACT

Embodiments described herein relate to magnetic and electromagnetic systems and a method for controlling the density profile of plasma generated in a process volume of a PECVD chamber to affect deposition profile of a film. In one embodiment, a plurality of retaining brackets is disposed in a rotational magnetic housing of the magnetic housing systems. Each retaining bracket of the plurality of retaining brackets is disposed in the rotational magnetic housing with a distance d between each retaining bracket. The plurality of (Continued)

retaining brackets has a plurality of magnets removably disposed therein. The plurality of magnets is configured to travel in a circular path when the rotational magnetic housing is rotated around the round central opening.

12 Claims, 7 Drawing Sheets

(51) Int. Cl.
C23C 16/505 (2006.01)
C23C 16/455 (2006.01)
H01L 21/3065 (2006.01)
H01L 21/02 (2006.01)

(52) U.S. Cl.
CPC .. *H01J 37/32623* (2013.01); *H01J 37/32715* (2013.01); *H01L 21/02274* (2013.01); *H01L 21/3065* (2013.01)

(56) References Cited

U.S. PATENT DOCUMENTS

| | | | | |
|---|---|---|---|---|
| 6,014,943 | A * | 1/2000 | Arami | H01J 37/32082 156/345.46 |
| 6,173,673 | B1 * | 1/2001 | Golovato | H01L 21/67069 156/345.47 |
| 6,245,190 | B1 * | 6/2001 | Masuda | H01J 37/32678 156/345.46 |
| 6,436,230 | B1 | 8/2002 | Kondo et al. | |
| 6,514,377 | B1 * | 2/2003 | Morimoto | H01J 37/3405 156/345.46 |
| 6,764,575 | B1 * | 7/2004 | Yamasaki | H01J 37/3408 156/345.46 |
| 2001/0032591 | A1 | 10/2001 | Carducci et al. | |
| 2004/0045934 | A1 | 3/2004 | Harvey et al. | |
| 2004/0238125 | A1 * | 12/2004 | Ono | H01J 37/32623 156/345.46 |
| 2005/0039854 | A1 * | 2/2005 | Matsuyama | H01L 21/3065 156/345.43 |
| 2005/0211383 | A1 * | 9/2005 | Miyata | H01L 21/67069 156/345.46 |
| 2005/0279624 | A1 | 12/2005 | Brcka | |
| 2006/0081559 | A1 * | 4/2006 | Miyata | H01J 37/32623 156/345.46 |
| 2008/0277063 | A1 * | 11/2008 | Shin | H01J 37/3266 118/723 R |
| 2010/0024983 | A1 | 2/2010 | Honda et al. | |
| 2013/0010454 | A1 | 1/2013 | Takayama et al. | |
| 2016/0163511 | A1 * | 6/2016 | Nguyen | H01L 21/02274 156/345.34 |
| 2016/0293389 | A1 | 10/2016 | Chen et al. | |
| 2017/0040140 | A1 | 2/2017 | Tanaka et al. | |
| 2019/0244754 | A1 * | 8/2019 | Yang | H01F 7/0273 |
| 2021/0050189 | A1 * | 2/2021 | Gottheim | C23C 16/509 |

OTHER PUBLICATIONS

International Search Report/Written Opinion issued in PCT/US2019/059344 dated Feb. 24, 2020.

* cited by examiner

MAGNETIC HOUSING SYSTEMS

CROSS-REFERENCE TO RELATED APPLICATIONS

This application claims priority to U.S. Provisional Patent Application Ser. No. 62/755,847, filed on Nov. 5, 2018, and U.S. Provisional Patent Application Ser. No. 62/888,332, filed on Aug. 16, 2019, which herein are incorporated by reference.

BACKGROUND

Field

Embodiments of the present disclosure generally relate to magnetic housing systems for controlling properties of generated plasma, and plasma enhanced deposition systems having the same.

Description of the Related Art

Plasma enhanced chemical vapor deposition (PECVD) is generally employed to deposit a film on a substrate, such as a semiconductor wafer. Plasma etching is generally employed to etch a film disposed on a substrate. PECVD and plasma etching are accomplished by introducing one or more gases into a process volume of a process chamber that contains a substrate. The one or more gases mix in a diffuser situated near the top of the chamber and are injected into a process volume through a plurality of holes or nozzles of the diffuser. During PECVD and plasma etching, the mixture of the one or more gases in the process volume are energized (e.g., excited) to generate a plasma by applying radio frequency (RF) energy to the chamber from one or more RF sources coupled to the chamber. An electric filed is generated in the process volume such that atoms of a mixture of the one or more gases present in the process volume are ionized and release electrons. The ionized atoms accelerated to the substrate support in PECVD facilitate deposition of a film on the substrate. The ionized atoms accelerated to the substrate support in plasma etching facilitate etching of a film disposed on the substrate.

The plasma generated in the process volume has properties, such as a density profile. A non-uniform density profile may cause non-uniform deposition or etching of the film on the substrate. In particular, the density profile of the plasma affects the deposition thickness or the etch profile of the film across a surface of the substrate. Accordingly, what is needed in the art are systems and a method for controlling the properties of the plasma generated in a process volume of a PECVD chamber.

SUMMARY

In one embodiment, a system is provided. The system includes a rotational magnetic housing having an upper plate, an outer sidewall, an inner sidewall defining a round central opening, and a lower plate. A plurality of retaining brackets are disposed in the rotational magnetic housing. Each retaining bracket of the plurality of retaining brackets disposed in the rotational magnetic housing with a distance d between each retaining bracket. The plurality of retaining brackets have a plurality of magnets removably disposed therein. Each magnet of the plurality of magnets is retained in a respective retaining bracket with a pitch p between each magnet of the plurality of magnets, and the plurality of magnets are configured to travel in a circular path when the rotational magnetic housing is rotated around the round central opening.

In another embodiment, a chamber is provided. The chamber includes a chamber body, a chamber lid having a gas distribution assembly, a substrate support positioned opposite the gas distribution assembly to define a process volume, the process volume having a center axis, a radio frequency (RF) source operable to be coupled to an electrode disposed within substrate support, and a rotational magnetic housing system having a rotational magnetic housing coupled to the chamber. The rotational magnetic housing has an upper plate, an outer sidewall, an inner sidewall defining a round central opening, and a lower plate. A plurality of retaining brackets are disposed in the rotational magnetic housing. Each retaining bracket of the plurality of retaining brackets disposed in the rotational magnetic housing with a distance d between each retaining bracket. The plurality of retaining brackets have a plurality of magnets removably disposed therein. Each magnet of the plurality of magnets is retained in a respective retaining bracket with a pitch p between each magnet of the plurality of magnets, and the plurality of magnets are configured to travel in a circular path when the rotational magnetic housing is rotated In yet another embodiment, a chamber is provided. The chamber includes a chamber body, a chamber lid having a gas distribution assembly, a substrate support positioned opposite the gas distribution assembly to define a process volume, the process volume having a center axis, a radio frequency (RF) source operable to be coupled to an electrode disposed within substrate support, and an electromagnet magnetic housing system. The electromagnet magnetic housing system includes an electromagnet housing coupled to the chamber. The electromagnet housing has an upper plate, an outer sidewall, an inner sidewall defining a round central opening, a lower plate, and two or more conductive wires. Each of the conductive wires are coiled one or more times in respective portions of the electromagnet housing. Each of the conductive wires are operable to be individually connected to a power source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide magnetic and electromagnetic housing systems and a method for controlling the properties of plasma generated in a process volume of a PECVD chamber to affect deposition properties of a film. In one embodiment, a plurality of retaining brackets is disposed in a rotational magnetic housing of the magnetic housing systems. Each retaining bracket of the plurality of retaining brackets is disposed in the rotational magnetic housing with a distance d between each retaining bracket. The plurality of retaining brackets has a plurality of magnets removably disposed therein. Each magnet of the plurality of magnets is retained in a respective retaining bracket with a pitch p between each magnet of the plurality of magnets, and the plurality of magnets are configured to travel in a circular path when the rotational magnetic housing is rotated around the round central opening.

Figure 1A:
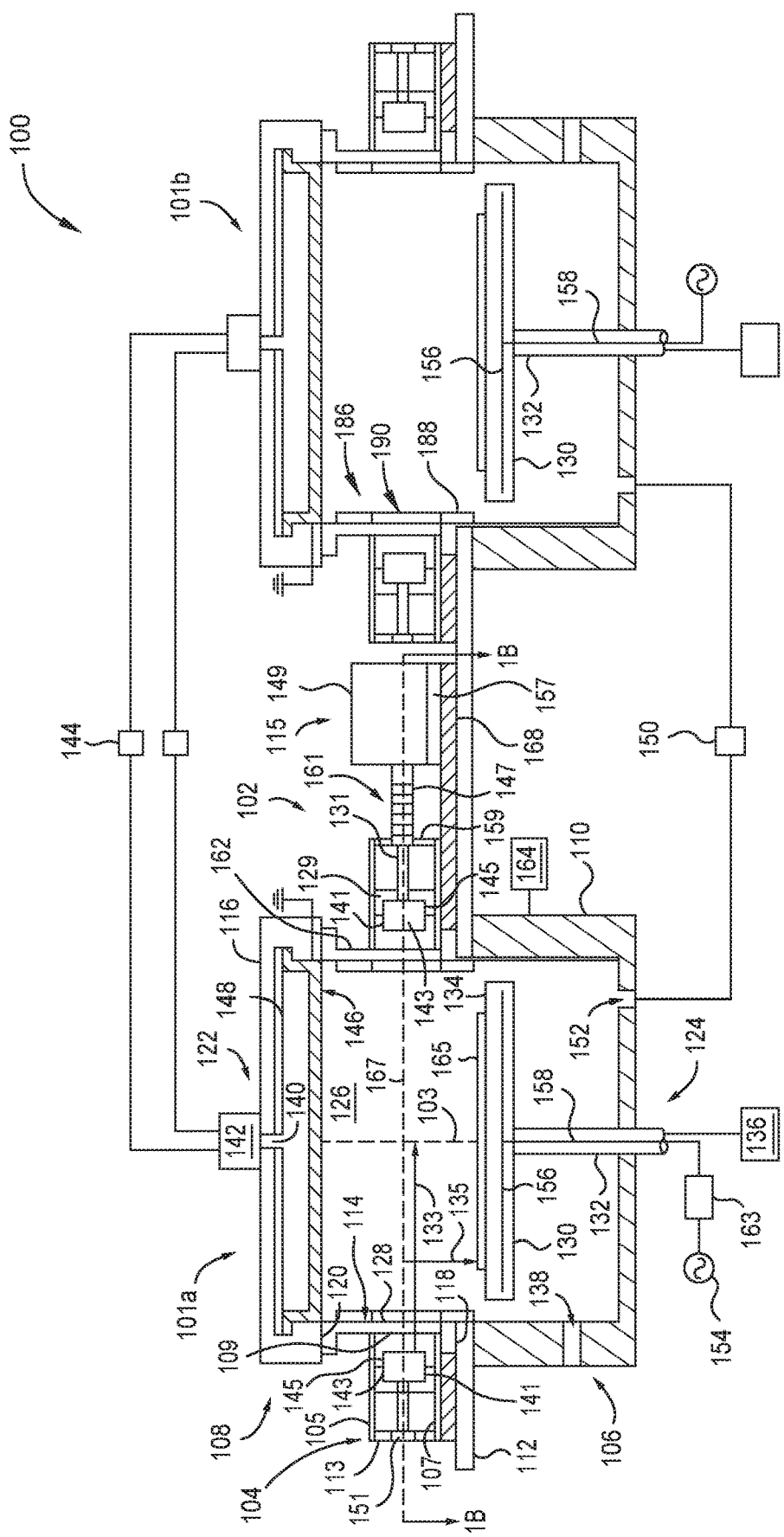
FIG. 1A is a schematic cross-sectional view of a plasma-enhanced chemical vapor deposition (PECVD) chamber having a rotational magnetic housing system with a rotational magnetic housing disposed outside of the chamber according to one embodiment.
Figure 1B:
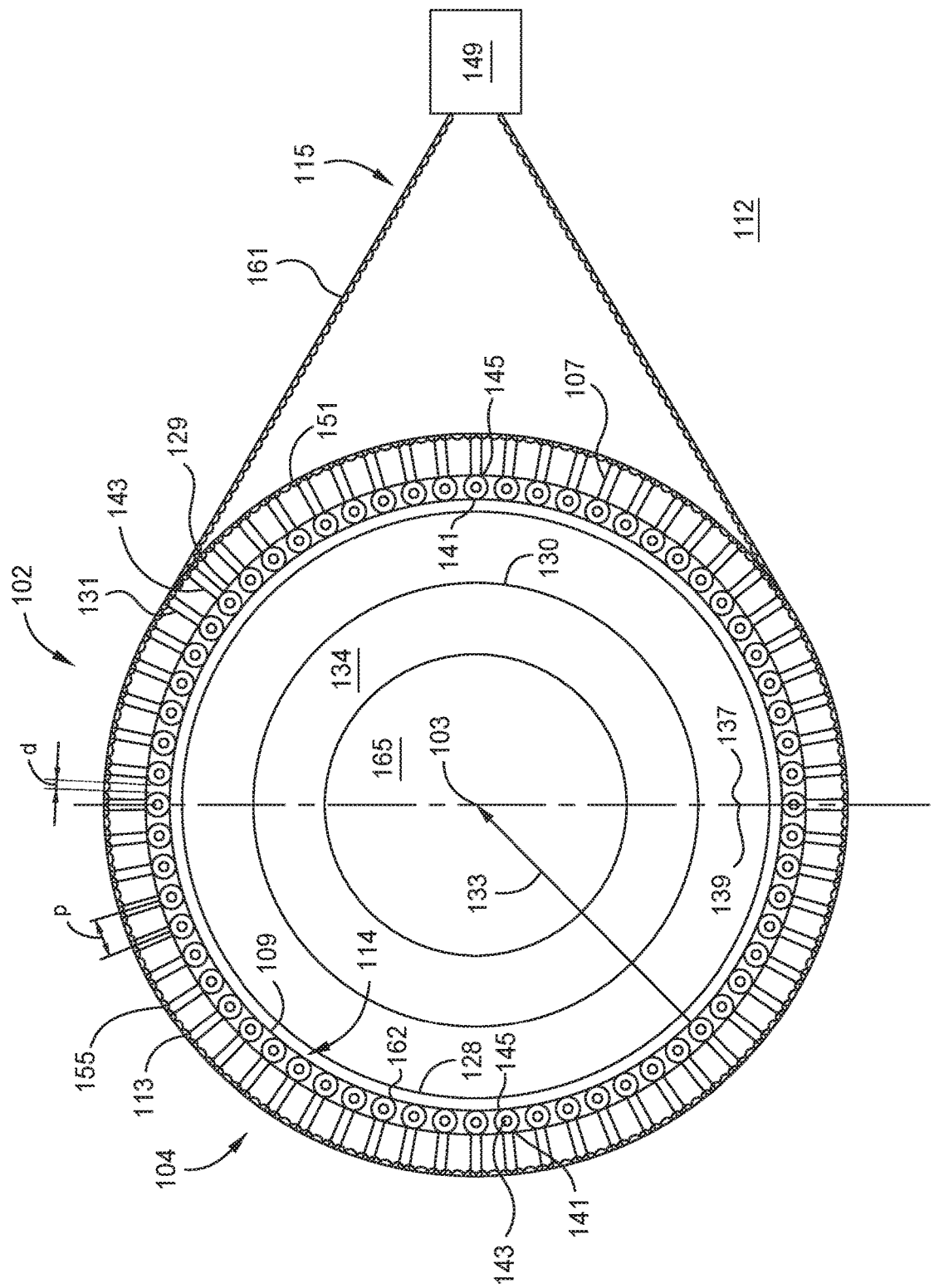
FIG. 1B is a schematic top view of a rotational magnetic housing system according to one embodiment.
Figure 1C:
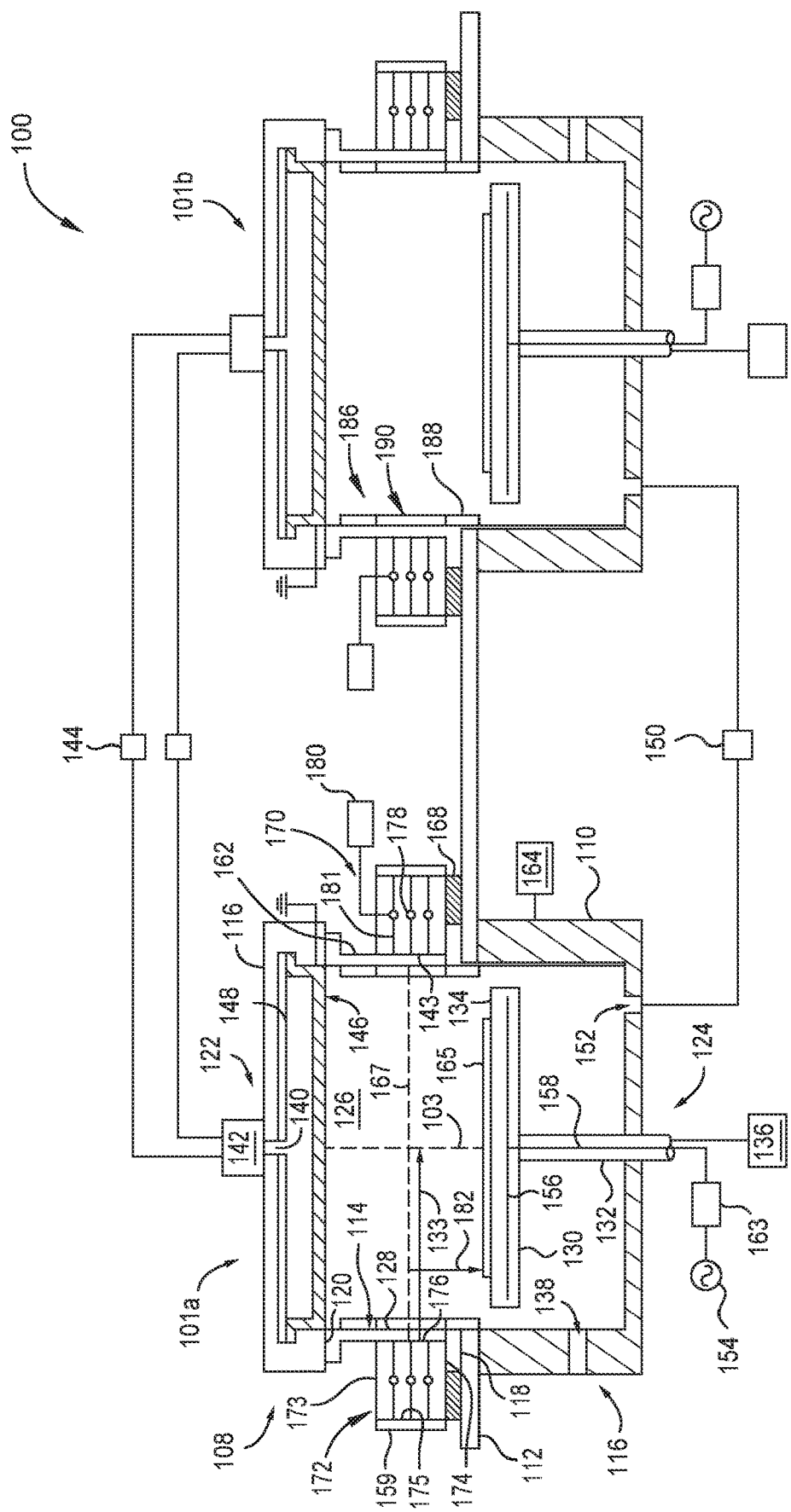
FIG. 1C is a schematic cross-sectional view of a PECVD chamber having an electromagnet housing system with an electromagnet magnetic housing disposed outside of the chamber according to one embodiment.
Figure 1D:
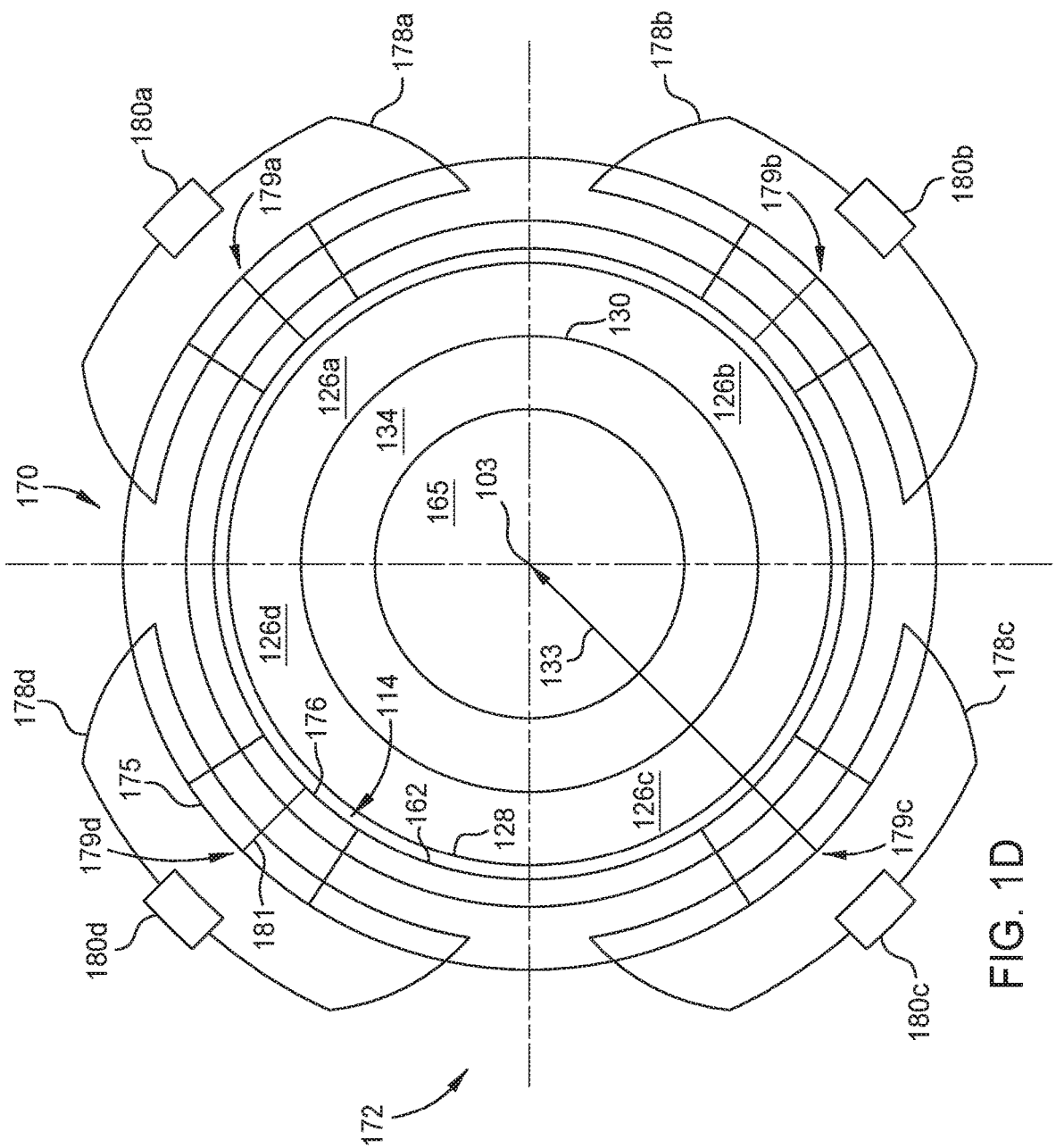
FIG. 1D is a schematic top view of an electromagnet housing system according to one embodiment.
Figure 1E:
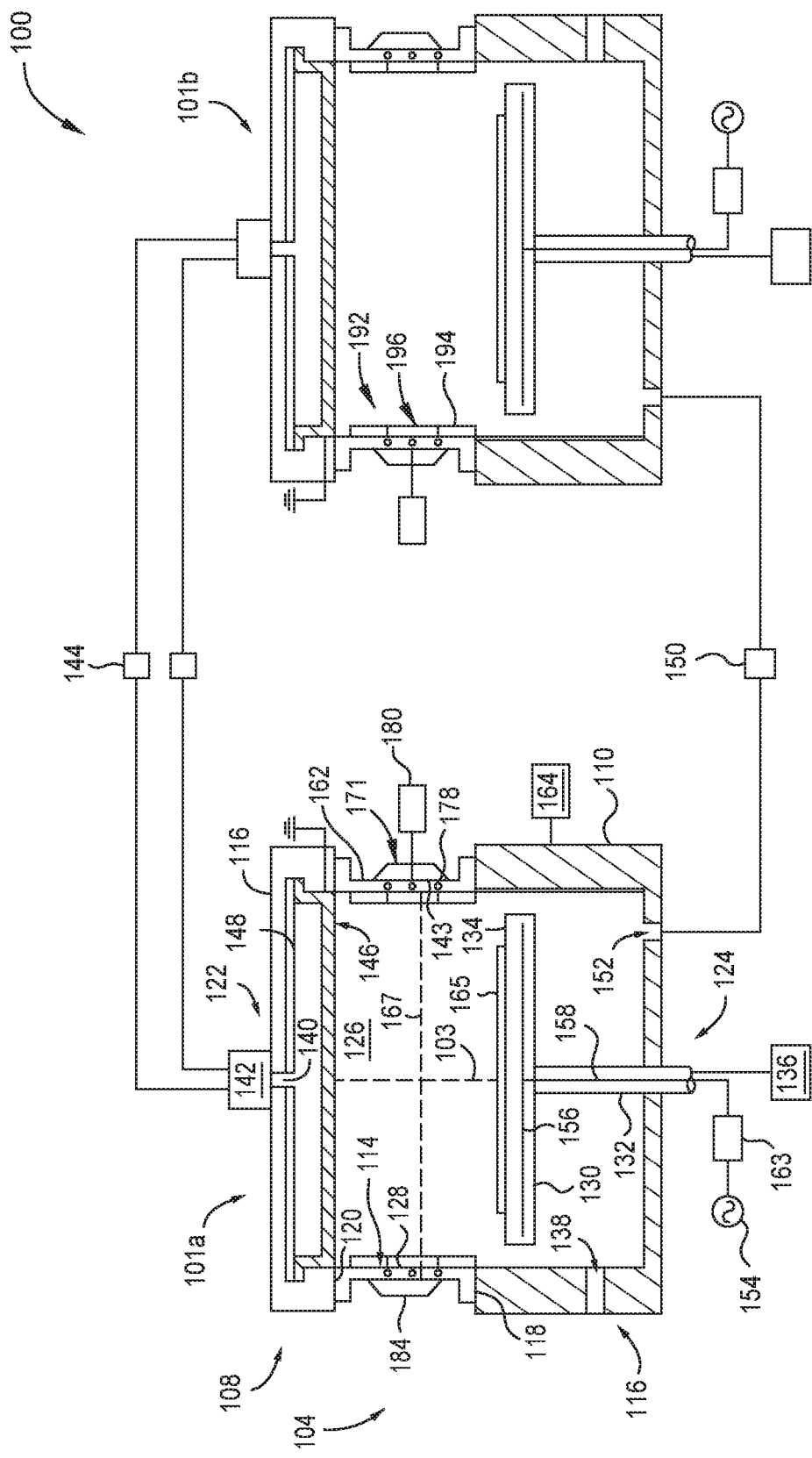
FIG. 1E is a schematic cross-sectional view of a PECVD chamber having an electromagnet system according to one embodiment.

FIGS. 1A, 1C, and 1E are schematic cross-sectional views of a plasma-enhanced chemical vapor deposition (PECVD) system 100 according to various embodiments. One example of the system 100 is a PRODUCER® system manufactured by Applied Materials, Inc., located in Santa Clara, Calif. It is to be understood that the system described below is an exemplary chamber and other systems, including systems from other manufacturers, may be used with or modified to accomplish aspects of the present disclosure. The system 100 includes a chamber 101a (e.g., first chamber) and a chamber 101b (e.g., second chamber). In one embodiment, which can be combined with other embodiments described herein, the chambers 101a, 101b share resources. For example, the chambers 101a, 101b may share at least one or more gas sources 144, a mounting plate 112, and a pump 150. The chambers 101a, 101b are similarly configured. However, it is also contemplated that each of chambers 101a, 101b have dedicated resources.

In the embodiments of FIG. 1A, each chamber 101a, 101b has a rotational magnetic housing system 102 with a rotational magnetic housing 104 disposed outside of the chamber 101a, 101b. In the embodiments of FIG. 1C, each chamber 101a, 101b has an electromagnet housing system 170 with an electromagnet housing 172 disposed outside of the chamber 101a, 101b. In the embodiments of FIG. 1E, each chamber 101a, 101b has an electromagnet system 171 disposed in a spacer 114 of the chamber lid assembly 108. While aspects of chamber 101a are discussed, it is to be understood that chamber 101b is similarly equipped. Reference numerals may be omitted on chamber 101b for clarity in FIGS. 1A, 1C, and 1E.

The chamber 101a, 101b has a chamber body assembly 106 and a chamber lid assembly 108. The chamber body assembly 106 of the embodiments of FIGS. 1A and 1C includes a chamber body 110 coupled to a mounting plate 112. The chamber lid assembly 108 of the embodiments of FIGS. 1A and 1C includes a spacer 114 having a first flange 118 coupled to the mounting plate 112 and a chamber lid 116 coupled to a second flange 120 of the spacer 114. The chamber lid assembly 108 of the embodiments of FIG. 1E includes the spacer 114 having the first flange 118 coupled to the chamber body 110 and the chamber lid 116 coupled to a second flange 120 of the spacer 114. The chamber lid 116 includes a gas distribution assembly 122. The gas distribution assembly 122 is positioned opposite a substrate support assembly 124 defining a process volume 126 therebetween. The process volume 126 of the embodiments of FIGS. 1A and 1C is further defined by the chamber lid 116, an interior wall 128 of the spacer 114, mounting plate 112, and chamber body 110. The process volume 126 of the embodiments of FIG. 1E is further defined by the chamber lid 116, the interior wall 128 of the spacer 114, and chamber body 110.

The substrate support assembly 124 is disposed within the process volume 126. The substrate support assembly 124 includes a substrate support 130 and a stem 132. The substrate support 130 has a support surface 134 for supporting a substrate 165. The substrate support 130 typically includes a heating element (not shown). The substrate support 130 is movably disposed in the process volume 126 by the stem 132 which extends through the chamber body 110 where the stem 132 is connected to a substrate support drive system 136. The substrate support drive system 136 moves the substrate support 130 between an elevated processing position (as shown) and a lowered position that facilitates substrate transfer to and from the process volume 126 through a slit valve 138 formed though the chamber body 110. In one embodiment, which can be combined with other embodiments described herein, the substrate support drive system 136 rotates the stem 132 and the substrate support 130.

In one embodiment, which can be combined with other embodiments described herein, the gas distribution assembly 122 is configured to distribute gases uniformly into the process volume 126 of the chamber 101a, 101b to facilitate deposition of a film, such as an advanced patterning film, on the substrate 165 positioned on the substrate support 130 of the substrate support assembly 124. In another embodiment, which can be combined with other embodiments described herein, the gas distribution assembly 122 is configured to distribute gases uniformly into the process volume 126 of the chamber 101a, 101b to facilitate etching of a film, such as an advanced patterning film, disposed on the substrate 165 positioned on the substrate support 130 of the substrate support assembly 124.

The gas distribution assembly 122 includes a gas inlet passage 140, which delivers gases from a flow controller 142 coupled to one or more gas sources 144 through a diffuser 146 suspended from a hanger plate 148. The diffuser 146 includes a plurality of holes or nozzles (not shown) through which gaseous mixtures are injected into the process volume 126 during processing. The pump 150 is coupled to an outlet 152 of the chamber body 110 for controlling the pressure within the process volume 126 and exhausting byproducts from the process volume 126. The diffuser 146 of gas distribution assembly 122 can be connected to an RF return (or ground) allowing RF energy applied to the substrate support 130 to generate an electric field within the process volume 126, which is used to generate the plasma for processing of the substrate 165.

A RF source 154 is coupled to the electrode 156 disposed within substrate support 130 through a conductive rod 158 disposed through the stem 132. In one embodiment, which can be combined with other embodiments described herein, the electrode 156 is connected to the RF source 154 through a match box 163 having a match circuit for adjusting and a sensor for measuring electrical characteristics, such as voltage, current, and impedance, of the electrode 156. The match circuit may facilitate adjustment of voltage, current, or impedance in response to a signal from the sensor. The diffuser 146 of gas distribution assembly 122, which is connected to an RF return, and the electrode 156 facilitate formation of a capacitive plasma coupling. The RF source 154 provides RF energy to the substrate support 130 to facilitate generation of a capacitive coupled plasma between the substrate support 130 and the diffuser 146 of the gas distribution assembly 122. When RF power is supplied to the electrode 156, an electric filed is generated between the diffuser 146 and the substrate support 130 such that atoms of gases present in the process volume 126 between the substrate support 130 and the diffuser 146 are ionized and release electrons. The ionized atoms accelerated to the substrate support 130 facilitate deposition or etching of the film the substrate 165 positioned on a substrate support 130.

Figure 3A:
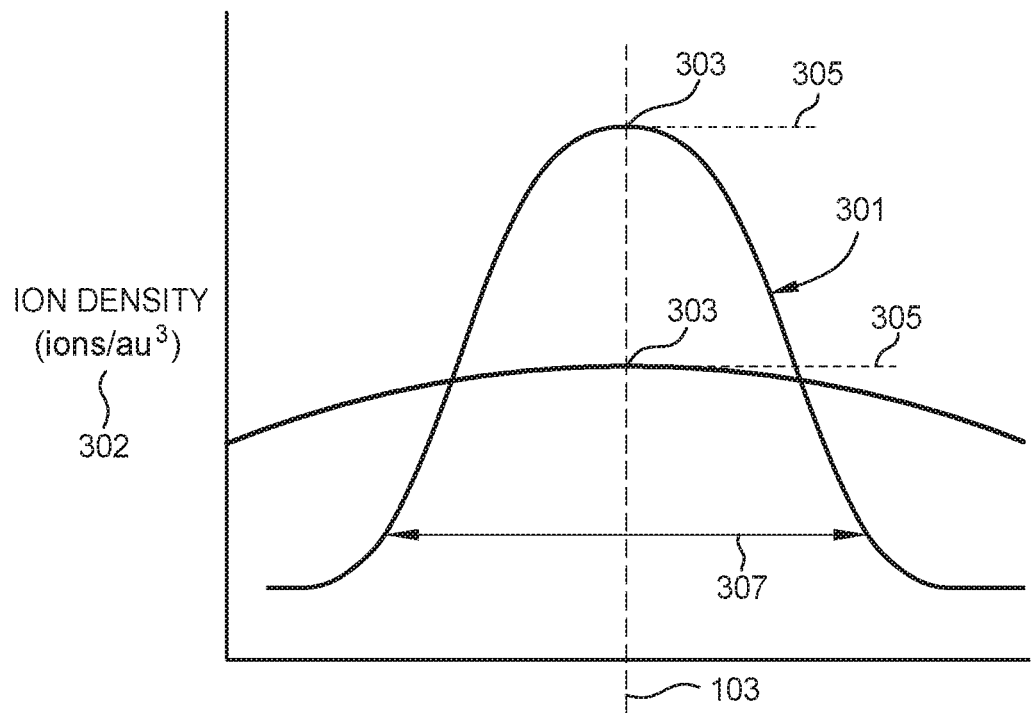
FIGS. 3A and 3B are graphs illustrating a density profile of a plasma in a process volume according to an embodiment.

As shown in FIG. 3A, the plasma has density profile 301 in the process volume 126. The density profile 301 corresponds to an ion density 302 (ions/au$^3$) at a position 304 on a horizontal plane 167 in the process volume 126. The density profile 301 includes a peak 303 corresponding to a maximum 305 of the ion density and a width 307 corresponding to a diameter of the plasma. One of the rotational magnetic housing system 102, the electromagnet housing system 170, and the electromagnet system 171 and the method described herein provide for control the density profile 301 the plasma to tune the uniformity and properties of the deposited or etched film. In the embodiments of FIG. 1A, rotational speed of the magnets, strength of the magnets (Gauss), and vertical position of the magnets can be adjusted to facilitate a corresponding adjustment in the density profile of the plasma. In the embodiments of FIG. 1C, flow of current of the electromagnet, strength of the electromagnet (Gauss), and vertical position of the electromagnet can be adjusted to facilitate a corresponding adjustment in the density profile of the plasma. In the embodiments of FIG. 1E, flow of current of the electromagnet and strength of the electromagnet can be adjusted to facilitate a corresponding adjustment in the density profile of the plasma. For example, adjustments can be made to one or more of vertical position of a plasma relative to a substrate, peak position of the density profile, or the value of the ion density at a particular location relative to a substrate.

As shown in FIG. 1A, a controller 164 coupled to the chamber 101a, 101b and the rotational magnetic housing system 102 is configured to control aspects of the chamber 101a, 101b and the rotational magnetic housing system 102 during processing. As shown in FIG. 1C, the controller 164 coupled to the chamber 101a, 101b and the electromagnet housing system 170 is configured to control aspects of the chamber 101a, 101b and the electromagnet housing system 170 during processing. As shown in FIG. 1E, the controller 164 coupled to the chamber 101a, 101b and the electromagnet system 171 is configured to control aspects of the chamber 101a, 101b and the electromagnet system 171 during processing.

As shown in FIG. 3A, the strength of one of the magnets 143 and a core material of the electromagnet (shown in FIGS. 1C and 1E) compresses the density profile 301 of the plasma in the process volume 126 and extends the sheath of the plasma toward the sidewalls of the chamber body 110. Compressing the density profile 301 of the plasma results in a more uniform concentration of ions and radicals over the substrate 165 (at a relative height above the substrate) for a uniform deposition profile. Additionally, compression of the density profile 301 extends the plasma sheath radially outward towards the sidewalls of the chamber body 110. Extending the sheath of the plasma to the sidewalls of the chamber body 110 provides a short and symmetrical path for RF energy to propagate from the sidewalls to a ground. The path for RF energy to propagate from the sidewalls to the ground improves current flow and reduces the amount of current required by the electrode 156 of the substrate support 130 through increased efficiency. The reduction of the amount of current required by the electrode 156 allows for the delivery of increased voltage to electrode 156 through increased efficiency. The increased voltage results in greater ionization of the plasma sheath for increased ion or radical bombardment of the substrate 165. Increased ion or radical bombardment of the substrate 165 reduces the stress of the film to be deposited or etched. Additionally, the compression of the density profile 301 and the extension of the plasma sheath provides for a substantially uniform distribution of stress vectors of the deposited or etched film.

FIG. 1B illustrates a schematic top view of the rotational magnetic housing system 102. Referring to FIG. 1A and FIG. 1B, the rotational magnetic housing system 102 includes the rotational magnetic housing 104 configured to rotate about a center axis 103 of the process volume 126 to create static or dynamic magnetic fields. The magnetic fields modify the shape of the plasma, concentration of ions and radicals, and movement of concentration of ions and radicals to control the density profile 301 of the plasma within the process volume 126.

The rotational magnetic housing system 102 with the rotational magnetic housing 104 is disposed outside of the chamber 101a, 101b. The rotational magnetic housing system 102 includes an upper plate 105, a lower plate 107 disposed opposite to the upper plate 105, an inner sidewall 109, an outer sidewall 113 disposed opposite the inner sidewall 109, a housing lift system 168, and a housing drive system 115. The interior side 128 defines a round central opening. In one embodiment, which can be combined with other embodiments described herein, at least one of the upper plate 105, lower plate 107, and spacer 114 includes one or more channels (not shown) connected to a heat exchanger (not shown) to control a temperature profile of the rotational magnetic housing 104. An exterior wall 162 of the spacer 114 includes a polymer material, such as PTFE (polytetrafluoroethylene). In one embodiment, which can be combined with other embodiments described herein, the exterior wall 162 is a sheet of polymer material. The polymer material of the exterior wall 162 of the spacer 114 allows the rotational magnetic housing 104 to rotate around the spacer 114 about the center axis 103 of the process volume 126.

The rotational magnetic housing 104 includes a plurality of retaining brackets 129. Each retaining bracket of the plurality of retaining brackets 129 is disposed in the rotational magnetic housing 104 with a distance d between each retaining bracket 129. The plurality of retaining brackets 129 enables a plurality of magnets 143 to be disposed in or removed from the rotational magnetic housing 104. In one embodiment, each magnet 143 of the plurality of magnets 143 is retained in a retaining bracket 129 with a pitch p between each magnet 143 of the plurality of magnets 143.

The pitch p corresponds to a distance between each adjacent magnet 143 of the plurality of magnets 143. The pitch p tunes the magnetic fields generated by rotating the rotational magnetic housing 104. In one embodiment, which can be combined with other embodiments described herein, each of the retaining brackets 129 is coupled to tracks 131. The retaining brackets 129 are actuated such that each of the retaining brackets 129 are operable to slide along the tracks 131 in a radial direction to vary a horizontal distance 133 from each of the magnets 143 to the center axis 103 of the process volume 126.

As shown in FIG. 1C, the electromagnet housing system 170 with the electromagnet housing 172 is disposed outside of the chamber 101a, 101b. The electromagnet housing 172 includes an upper plate 173, a lower plate 174 disposed opposite to the upper plate 173, an inner sidewall 176, an outer sidewall 175 disposed opposite the inner sidewall 176, and a housing lift system 168. The interior side 128 defines a round central opening. In one embodiment, which can be combined with other embodiments described herein, at least one of the upper plate 173, lower plate 174, and spacer 114 includes one or more channels (not shown) connected to a heat exchanger (not shown) to control a temperature profile of the electromagnet housing 172. An electrically conductive wire 178 is disposed in the electromagnet housing 172 and is coiled around the spacer 114 one or more times to form a single electromagnet which circumscribes the spacer 114. A power source 180 is coupled to the conductive wire 178 to flow current in a circular path about the process volume 126. In one embodiment, which can be combined with other embodiments described herein, at least one turn of the conductive wire 178 coupled to tracks 181. The tracks 181 are actuated such that each turn of the conductive wire 178 coupled to one of the tracks 181 is operable to slide along the tracks 181 in a radial direction to vary a horizontal distance 133 from the conductive wire 178 to the center axis 103 of the process volume 126. As shown in FIG. 1E, the electrically conductive wire 178 is disposed in the spacer 114 and is coiled about the process volume 126 one or more times.

Figure 3B:
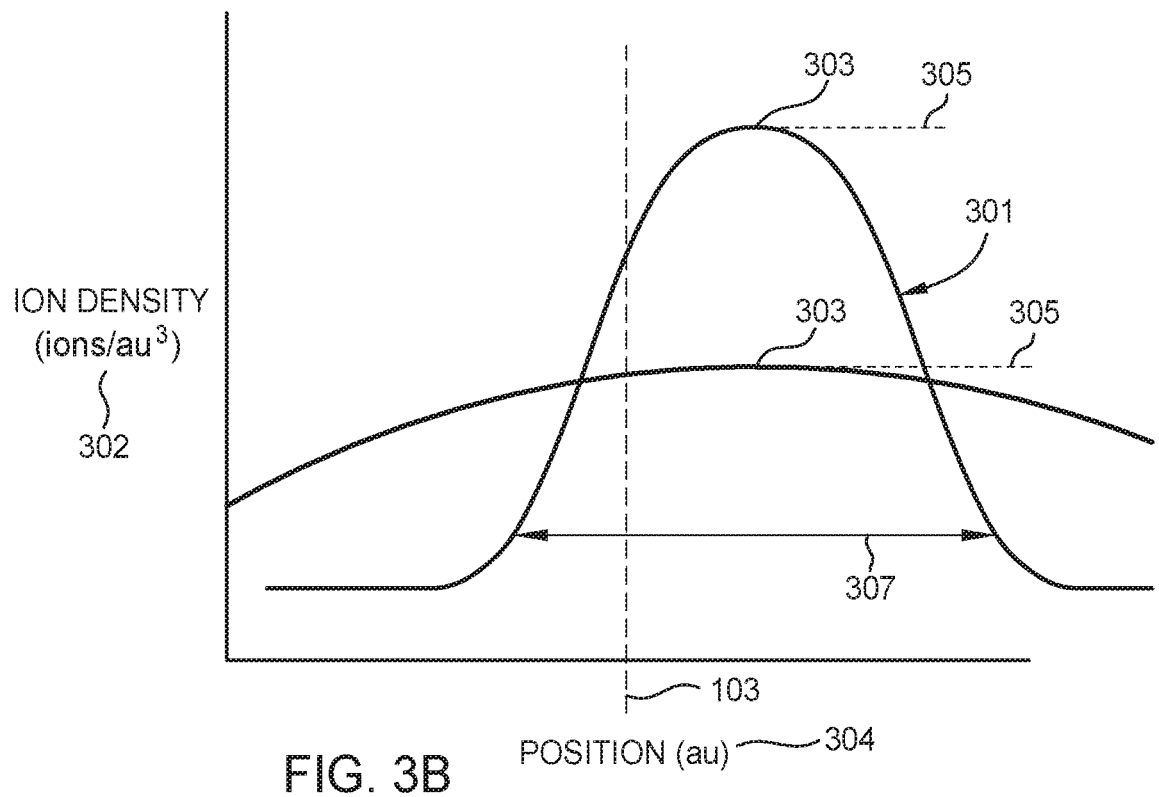

In one embodiment, as shown in FIG. 1B, which can be combined with other embodiments described herein, a first half 137 (e.g., encompassing about 180 degrees) of the rotational magnetic housing 104 has the magnets 143 with the north pole 141 oriented toward the process volume 126 and second half 139 (e.g., encompassing about 180 degrees) of the rotational magnetic housing 104 has the magnets 143 with the south pole 145 oriented opposite to the process volume 126. As shown in FIG. 3B, the first half 137 and the second half 139 with opposite oriented magnets 143 provide for shifting of the peak 303 of the density profile 301. The opposite polarities of the magnets 143 skews the B-field produced via the magnets 143. The skewing of the B-field shifts the peak 303 of the density profile 301. The shifting of the peak 303 corresponds to a shifting of the plasma sheath. The rotation of the rotational magnetic housing 104 facilitates a more uniform exposure of the substrate 165 to ions and radicals of the skewed plasma sheath.

The rotational magnetic housing 104 is coupled to the housing drive system 115. The housing drive system 115 includes a belt 147 and a motor 149. The rotational magnetic housing 104 includes a plurality of grooves 151 formed in an outer sidewall 113 of the rotational magnetic housing 104. Each groove of the plurality of grooves 151 corresponds to a lug 155 of a plurality of lugs 155 of the belt 161. The belt 161 is configured to be disposed around the rotational magnetic housing 104 and is coupled to the motor 149, such as a brushless DC electric motor. The housing drive system 115 is configured to rotate the rotational magnetic housing 104 about the center axis 103 of the process volume 126 at a rotation rate. The rotation rate controls a current of the substrate 165 resulting from the modified magnetic fields. In one example, it is contemplated that each of chambers 101a, 101b includes individual housing drive systems 115. In another example, it is contemplated that each of chambers 101a, 101b share a housing drive system 115.

In some embodiments of FIGS. 1C and 1E, which can be combined with other embodiments described herein, the conductive wire 178 includes at least one of air gaps in the core material of the conductive wire 178, a varying cross sectional area of the core material, and a varying distance between each turn of the conductive wire 178. The core material of a first half (e.g., encompassing about 180 degrees) of the conductive wire 204 may have more air gaps than a second half (e.g., encompassing about 180 degrees) of the conductive wire 178. The core material of the first half of the conductive wire 178 may have a greater cross sectional area than the cross sectional area of the second half of the conductive wire 178. The distance between each turn of the conductive wire 178 of the first half may be less that than the distance between each turn of the conductive wire 178 of the second half. The adjustment of at least one of the air gaps, cross sectional area, and distance between each turn of the conductive wire 178 skews the B-field produced via the flow current through the conductive wire 178. The circular flow of current facilitates a more uniform exposure of the substrate 165 to ions and radicals of the skewed plasma sheath.

In other embodiments of FIGS. 1C and FIG. 1E, which can be combined with other embodiments described herein, the electromagnet housing 172 (FIG. 1C) and the electromagnet system 171 (FIG. 1E) include two or more electrically conductive wires 178. Each of the conductive wires 178 of the electromagnet housing 172 is disposed in a respective portion of the electromagnet housing 172. In one embodiment, which can be combined with other embodiments described herein, the conductive wires 178 are equally spaced from each other in the electromagnet housing 172. Each of the conductive wires 178 of the electromagnet system 171 is disposed in a respective portion of the spacer 110. In one embodiment, which can be combined with other embodiments described herein, the conductive wires 178 are equally spaced from each other in the spacer 110. Power sources 180 (180a, 180b, 180c, and 180d as shown in FIG. 1D) are individually coupled to each of the conductive wires 178. The power sources 180 operable to be electrically are connectable to the controller 164. The controller 164 is operable to sequentially turn on or off each of the power sources 180 and concurrently turn on or off each of the power sources 180 to control the supply of power to each of the conductive wires 178. Concurrently turning off each of the power sources 180 enables shunting of magnetic fields produced by the electromagnets. In one example, a first conductive wire is coiled one or more times in a semi-circle and is disposed in a first half of the electromagnet housing 172 (FIG. 1C) or spacer 110 (FIG. 1E) corresponding to a first half of the process volume 126 to form a first electromagnet. A second conductive wire is coiled one or more times in a semi-circle and is disposed in a second half of the electromagnet housing 172 (FIG. 1C) or spacer 110 (FIG. 1E) corresponding to a second half of the process volume 126 to form a second electromagnet. The first and second electromagnets may have opposing polarities.

As shown in FIG. 1D, a schematic top view of the electromagnet housing system 170, in one example, a first conductive wire 178a is coiled one or more times in a semi-circle having an angular arc of 90 degrees or less and is disposed in a first quadrant 179a of the electromagnet housing 172 corresponding to a first quadrant 126a of the process volume 126 to form a first electromagnet. A second conductive wire 178b is coiled one or more times in a semi-circle having an angular arc of 90 degrees or less and is disposed in a second quadrant 179b of the electromagnet housing 172 corresponding to a second quadrant 126b of the process volume 126 to form a second electromagnet. A third conductive wire 178c is coiled one or more times in a semi-circle having an angular arc of 90 degrees or less and is disposed in a third quadrant 179c of the electromagnet housing 172 corresponding to a third quadrant 126c of the process volume 126 to form a third electromagnet. A fourth conductive wire 178d is coiled one or more times in a semi-circle having an angular arc of 90 degrees or less and is disposed in a fourth quadrant 179d of the electromagnet housing 172 corresponding to a fourth quadrant 126d of the process volume 126 to form a fourth electromagnet. The first, second, third, and fourth electromagnets may have alternating polarities.

The housing drive system 115 and the rotational magnetic housing 104 are coupled to the housing lift system 168. Coupling the housing drive system 115 and the rotational magnetic housing 104 to the housing lift system 168 facilities vertical adjustment of the rotational magnetic housing 104 relative to a substrate 165. Coupling the electromagnet housing 172 to the housing lift system 168 facilities vertical adjustment of the electromagnet housing 172 relative to a substrate 165. For example, a vertical distance 135, defined by a plane formed through a center of each of the magnets 143 to the substrate 165, can be increased or decreased to adjust properties of plasma maintained within a corresponding chamber 101a or 101b. For example, a vertical distance 182, defined by a plane formed through a center of the conductive wire 178, can be increased or decreased to adjust properties of plasma maintained within a corresponding chamber 101a or 101b. The housing lift system 168 is operable to raise and lower the rotational magnetic housing 104 and the housing drive system 115 simultaneously, however, individual actuation is also contemplated. Raising and lowering a vertical distance 135, 182 from the substrate 165 provides adjustment of the distance of the plasma sheath to the substrate 165, and thus controls the movement of concentration of ions and radicals to control the uniformity and properties, such as stress, of the deposited or etched film. To facilitate vertical actuation, the housing lift system 168 may include one or more actuators, such as electric motors, stepper motors, screw drives with threaded rods, and the like, to facilitate vertical actuation relative to the mounting plate 112. In one embodiment, which can be combined with other embodiments described herein, the motor 149 is coupled to the housing lift system 168 by a mount 157.

In one embodiment, which can be combined with other embodiments described herein, the outer sidewall 113, 175 has a thickness 159. The materials and the thickness 159 of the outer sidewall 113, 175 provide for confinement of the magnetic fields to the process volume 126 by controlling the magnetic permeability of the outer sidewall 113, 175. As shown in FIG. 1E, the materials and the thickness of a shield 184 aligned with the conductive wire 178 and coupled to exterior wall 162 of the spacer 114 provide for confinement of the magnetic fields to the process volume 126. Confinement of the magnetic fields to the process volume 126 mitigates influence of the magnetic fields on nearby process volumes of adjacent process chambers, thus improving process uniformity. In one embodiment, which can be combined with other embodiments described herein, as shown in FIGS. 1A and 1C, the chamber 101a, 101b includes an actuated shield 186 operable to raise and lower such than an opening 190 of the body 188 of the actuated shield 186 is aligned with one of the conductive wire 178 and the magnets 143. In another embodiment, which can be combined with other embodiments described herein, as shown in FIG. 1E, the chamber 101a, 101b includes an shield 192 with an opening 196 of the body 194 of the shield 192 aligned with the conductive wire. The materials and the thickness of the actuated shield 186 and the shield 192 provide for confinement of the magnetic fields to the process volume 126.

Figure 2:
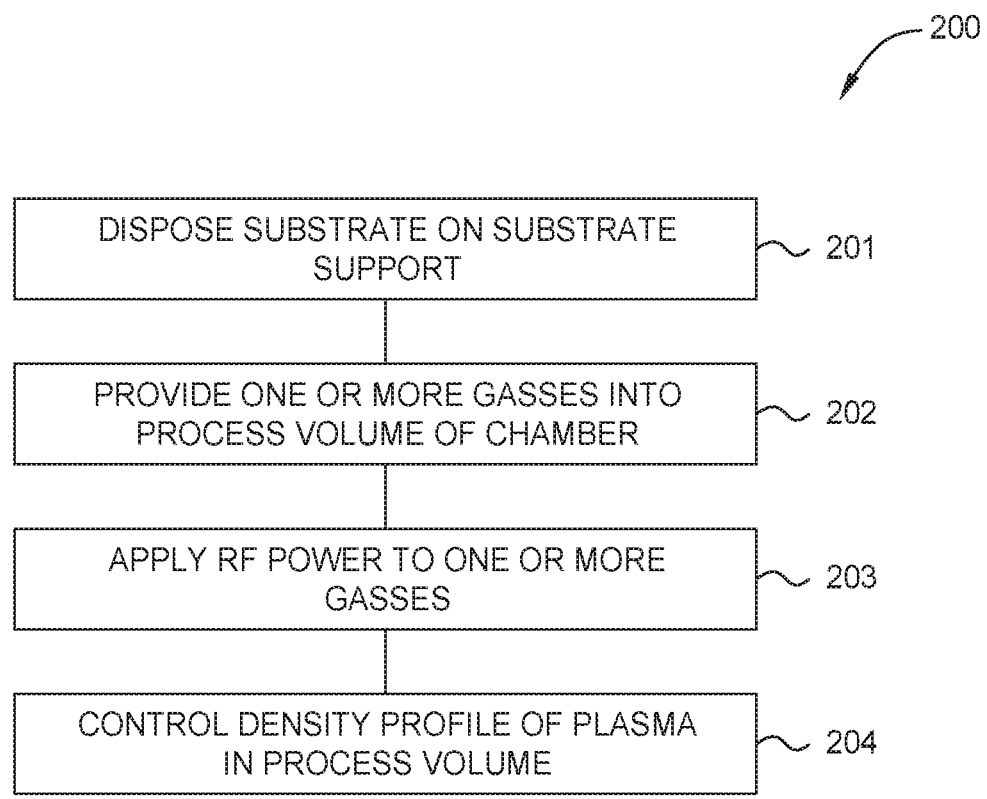
FIG. 2 is a flow diagram of a method of controlling a density profile of plasma formed in a process volume of a PECVD chamber according to one embodiment.

FIG. 2 is a flow diagram of a method 200 of controlling the density profile 301 of plasma formed in the process volume 126 of a PECVD chamber. To facilitate explanation, FIG. 2 will be described with reference to FIGS. 1A-1E. However, it is to be noted that PECVD systems other than the system 100 may be utilized in conjunction with method 200 and it is to be noted that magnetic housing assemblies other than the rotational magnetic housing system 102 may be utilized in conjunction with method 200.

At operation 201, a substrate 165 is disposed on the support surface 134 of the substrate support 130. In one embodiment, the substrate is transferred into the chamber 101a, 101b through the slit valve 138 formed though the chamber body 110 and disposed on the substrate support 130. The substrate support 130 is then raised by the substrate support drive system 136 to the elevated processing position in the process volume 126.

At operation 202, one or more gases are provided at a flow rate into the process volume 126 of the chamber 101a, 101b. In one embodiment, the flow controller 142 delivers one or more gases from the one or more gas sources 144 to the diffuser 146. The one or more gases mix and are injected into the process volume 126 through plurality of holes or nozzles of the diffuser 146. In one embodiment, the one or more gasses are continuously provided to the diffuser 146, mixed in the diffuser 146, and injected into the process volume 126. In another embodiment, the pump 150 maintains a pressure in the process volume. While pump 150 is shown in FIG. 1A as coupled to both chambers 101a, 101b, it is contemplated that each of chambers 101a, 101b may utilize a discrete pump 150.

At operation 203, RF power is applied to the mixture of the one or more gases. In one embodiment, the RF source 154 provides RF energy to the substrate support 130 to facilitate generation of the capacitive coupled plasma between the substrate support 130 and the diffuser 146 of the gas distribution assembly 122. The RF power is supplied to the electrode 156 and an electric filed is generated between the diffuser 146 and the substrate support 130 such that atoms of gases present in the process volume 126 between the substrate support 130 and the diffuser 146 are ionized and release electrons. The ionized atoms are accelerated to the substrate support 130 to facilitate the deposition of or etching of a film on the substrate 165 positioned on the substrate support 130.

At operation 204, the density profile 301 of the plasma formed in a process volume 126 is adjusted. In one embodiment, which can be combined with other embodiments described herein, the rotational magnetic housing 104 of the rotational magnetic housing system 102 is rotated via the housing drive system 115 about the center axis 103 of the process volume 126 at the rotation rate. At least one of the rotation rate, the horizontal distance 133 from each of the magnets 143 to the center axis 103, and the vertical distance 135 of a center of each of the magnets 143 to the substrate 165 may be adjusted during operation 204. In one embodiment, which can be combined with other embodiments described herein, current is provided to the conductive wire 178 in a circular path. The vertical distance 135 may be adjusted by raising and lowering at least one of the rotational magnetic housing 104 and the substrate support 130. The rotational magnetic housing 104 creates dynamic magnetic fields. The magnetic fields modify the shape of the plasma, concentration of ions and radicals, and movement of concentration of ions and radicals to control the density profile 301, the ion density 302, and the diameter of the plasma. Controlling the density profile 301, the ion density 302, and the diameter of the plasma the tunes the uniformity and properties of the deposited film. Each magnetic of the plurality of magnets 143 is retained in a retaining bracket with a pitch p between each magnetic of the plurality of magnets 143. The pitch p corresponds to a distance between each adjacent magnet of the plurality of magnets 143. The pitch p tunes the magnetic fields generated by rotating the rotational magnetic housing 104. Adjusting the vertical distance 135 modifies the distance of the plasma sheath to the substrate, and thus controls the movement of concentration of ions and radicals to control the uniformity and properties, such as stress, of the deposited film.

In another embodiment, at least one of the current, power, the horizontal distance 133 from the conductive wire 178 to the center axis 103, and the vertical distance 182 of a center of each of the conductive wire 178 to the substrate 165 may be adjusted during operation 204. The vertical distance 182 may be adjusted by raising and lowering at least one of the electromagnet housing 172 and the substrate support 130. The electromagnet housing 172 creates dynamic magnetic fields. The magnetic fields modify the shape of the plasma, concentration of ions and radicals, and movement of ions and radicals to control the density profile 301, the ion density 302, and the diameter of the plasma. Controlling the density profile 301, the ion density 302, and the diameter of the plasma the tunes the uniformity and properties of the deposited film. Adjusting the vertical distance 182 modifies the distance of the plasma sheath to the substrate, and thus controls the movement of ions and radicals to control the uniformity and properties, such as stress, of the deposited film.

In one embodiment, which can be combined with other embodiments described herein, at operation 204, the first half 137 and the second half 139 of the rotational magnetic housing 104 have opposite oriented magnets 143. In another embodiment, which can be combined with other embodiments described herein, at operation 204, the adjustment of at least one of the air gaps, cross sectional area, and distance between each turn of the conductive wire 178 may be adjusted. In another embodiment, which can be combined with other embodiments described herein, at operation 204, power is sequentially provided to two or more electromagnets having opposing or alternating polarities.

In some embodiments, the substrate support drive system 136 rotates the substrate support 130 about the center axis 103 of the process volume 126 at the rotation rate. The strength of the magnets 143 are selected to position a peak of a plasma profile in desired radial position above a surface of a substrate to be processed. In embodiments that include the opposite oriented magnets 143, the B-field produced via the magnets 143 is skewed. In embodiments that include adjustment of at least one of the air gaps, cross sectional area, and distance between each turn of the conductive wire 178, the B-field produced via the flow of current though the conductive wire 178 is skewed. In embodiments that include sequentially providing power to two or more electromagnets having opposing or alternating polarities, the B-field produced via the flow of current though the conductive wires 178 is skewed. The skewing of the B-field shifts the peak of the plasma sheath. However, during processing, the rotation of the magnets 143 and flow current through the conductive wire 178 in a circular path about the process volume 126 facilitates a more uniform exposure of the substrate to ions and radicals of the skewed plasma sheath. In other embodiments, the substrate is rotated, resulting in a uniform deposition profile. In contrast, conventional processes utilize a plasma profile in which the peak is centered above substrate. Such a configuration results in non-uniform deposition (e.g., center-heavy deposition), even with rotation of the substrate, due to the increased ion density at the center of the substrate relative to the radially-outward edges of a substrate.

It is contemplated that aspects of the disclosure may be utilized with permanent magnets, electromagnets, or a combination thereof. Additionally, it is contemplated that magnets may be arranged in a configuration of alternating polarities, or magnets of like-oriented polarities may be arranged in groups, such as groups encompassing about 180 degrees.

In summation, magnetic and electromagnetic systems and a method of controlling the density profile of plasma formed in a process volume of a PECVD chamber are described herein. In one embodiment, a rotational magnetic housing is configured to rotate about center axis of the process volume to create static or dynamic magnetic fields. The magnetic fields modify the shape of the plasma, concentration of ions and radicals, and movement of concentration of ions and radicals to control the density profile of the plasma. Controlling the density profile of the plasma tunes the uniformity and properties of a deposited or etched film.

While the foregoing is directed to examples of the present disclosure, other and further examples of the disclosure may be devised without departing from the basic scope thereof, and the scope thereof is determined by the claims that follow.

What is claimed is:

1. A system comprising:
    a rotational magnetic housing, comprising:
        an upper plate;
        an outer sidewall;
        an inner sidewall defining a round central opening; and
        a lower plate; and
    a plurality of retaining brackets disposed in the rotational magnetic housing, wherein:
        each retaining bracket of the plurality of retaining brackets is disposed in the rotational magnetic housing with a distance d between each retaining bracket;
        each retaining bracket has an upper surface coupled to the upper plate and a lower surface coupled to the lower plate of the rotational magnetic housing; and
        the plurality of retaining brackets have a plurality of magnets removably disposed therein, each magnet of the plurality of magnets is retained in a respective retaining bracket with a pitch p between each magnet of the plurality of magnets, and the plurality of magnets are configured to travel in a circular path when the rotational magnetic housing is rotated around the round central opening.

2. The system of claim 1, wherein the rotational magnetic housing is coupled to a drive system, the drive system comprising:
- a motor coupled to a belt, wherein the belt is to be disposed around the rotational magnetic housing, the belt has a plurality of lugs, and each lug corresponds to a groove of a plurality of grooves of the outer sidewall of the rotational magnetic housing.

3. The system of claim 2, wherein the drive system and the rotational magnetic housing are coupled to a housing lift system operable to raise and lower the rotational magnetic housing and the drive system.

4. The system of claim 3, wherein the rotational magnetic housing is coupleable to an exterior sidewall of a chamber.

5. The system of claim 1, wherein the retaining brackets are coupled to tracks and the retaining brackets are actuated to move on the tracks.

6. A chamber comprising:
- a chamber body;
- a chamber lid having a gas distribution assembly;
- a substrate support positioned opposite the gas distribution assembly to define a process volume, the process volume having a center axis;
- a radio frequency (RF) source operable to be coupled to an electrode disposed within substrate support; and
- a rotational magnetic housing system having a rotational magnetic housing coupled to the chamber, wherein the rotational magnetic housing comprises:
  - an upper plate;
  - an outer sidewall;
  - an inner sidewall defining a round central opening;
  - a lower plate; and
  - a plurality of retaining brackets disposed in the rotational magnetic housing, wherein:
    - each retaining bracket of the plurality of retaining brackets is disposed in the rotational magnetic housing with a distance d between each retaining bracket;
    - each retaining bracket has an upper surface coupled to the upper plate and a lower surface coupled to the lower plate of the rotational magnetic housing; and
    - the plurality of retaining brackets have a plurality of magnets removably disposed therein, wherein each magnet of the plurality of magnets is retained in a respective retaining bracket with a pitch p between each magnet of the plurality of magnets, and the plurality of magnets are configured to travel in a circular path when the rotational magnetic housing is rotated around the round central opening.

7. The chamber of claim 6, wherein the inner sidewall of the rotational magnetic housing is coupled to an exterior wall of a chamber spacer, the chamber spacer having:
- a first flange coupled to a mounting plate of the chamber body; and
- a second flange coupled to the chamber lid.

8. The chamber of claim 7, wherein the rotational magnetic housing is coupled to a drive system, the drive system comprises a motor coupled to a belt, the belt is to be disposed around the rotational magnetic housing, the belt has a plurality of lugs, and each lug corresponds to a groove of a plurality of grooves of the outer sidewall of the rotational magnetic housing.

9. The chamber of claim 8, wherein the drive system and the rotational magnetic housing are coupled to a housing lift system operable to raise and lower the rotational magnetic housing and the drive system.

10. The chamber of claim 7, wherein the exterior wall of the chamber spacer includes a polymer material.

11. The chamber of claim 6, wherein the substrate support is coupled to a substrate support drive system configured to rotate the substrate support about the center axis of the process volume.

12. The chamber of claim 6, wherein the retaining brackets are coupled to tracks and the retaining brackets are actuated to move on the tracks.

* * * * *